United States Patent [19]

Epstein et al.

[11] 4,101,852
[45] Jul. 18, 1978

[54] MICROACOUSTIC SHEAR BULK WAVE DEVICE

[75] Inventors: Max Epstein, Highland Park; Ashok L. Nalamwar, Freeport, both of Ill.

[73] Assignee: Northwestern University, Evanston, Ill.

[21] Appl. No.: 725,195

[22] Filed: Sep. 21, 1976

[51] Int. Cl.² .......................... H03H 7/30; H03H 7/10
[52] U.S. Cl. ...................................... 333/30 R; 333/72
[58] Field of Search ................................ 333/72, 30 R

[56] References Cited

U.S. PATENT DOCUMENTS

| | | | |
|---|---|---|---|
| 2,672,590 | 3/1954 | McSkimin | 333/30 R |
| 3,387,233 | 6/1968 | Parker, Jr. | 333/30 R |
| 3,593,214 | 7/1971 | Cooper | 333/30 R |
| 3,760,299 | 9/1973 | Vasile | 333/30 R |

FOREIGN PATENT DOCUMENTS 1,363,519   8/1974   United Kingdom .............. 333/30 R

*Primary Examiner*—Alfred E. Smith
*Assistant Examiner*—Harry E. Barlow
*Attorney, Agent, or Firm*—Kegan, Kegan & Berkman

[57] ABSTRACT

A microacoustic signal processing device for propagation of shear bulk waves in a substrate. A preferred embodiment of the device includes a substrate having opposed, polished principal and second surfaces. An input interdigital transducer supported on the principal surface includes a plurality of aluminum electrodes photoetched on the principal surface; a ZnO layer overlying the electrodes; and a conductive aluminum film overlying the ZnO layer. Shear bulk waves propagated by the input transducer are available for processing at various locations on the principal and second surfaces of the substrate.

8 Claims, 4 Drawing Figures

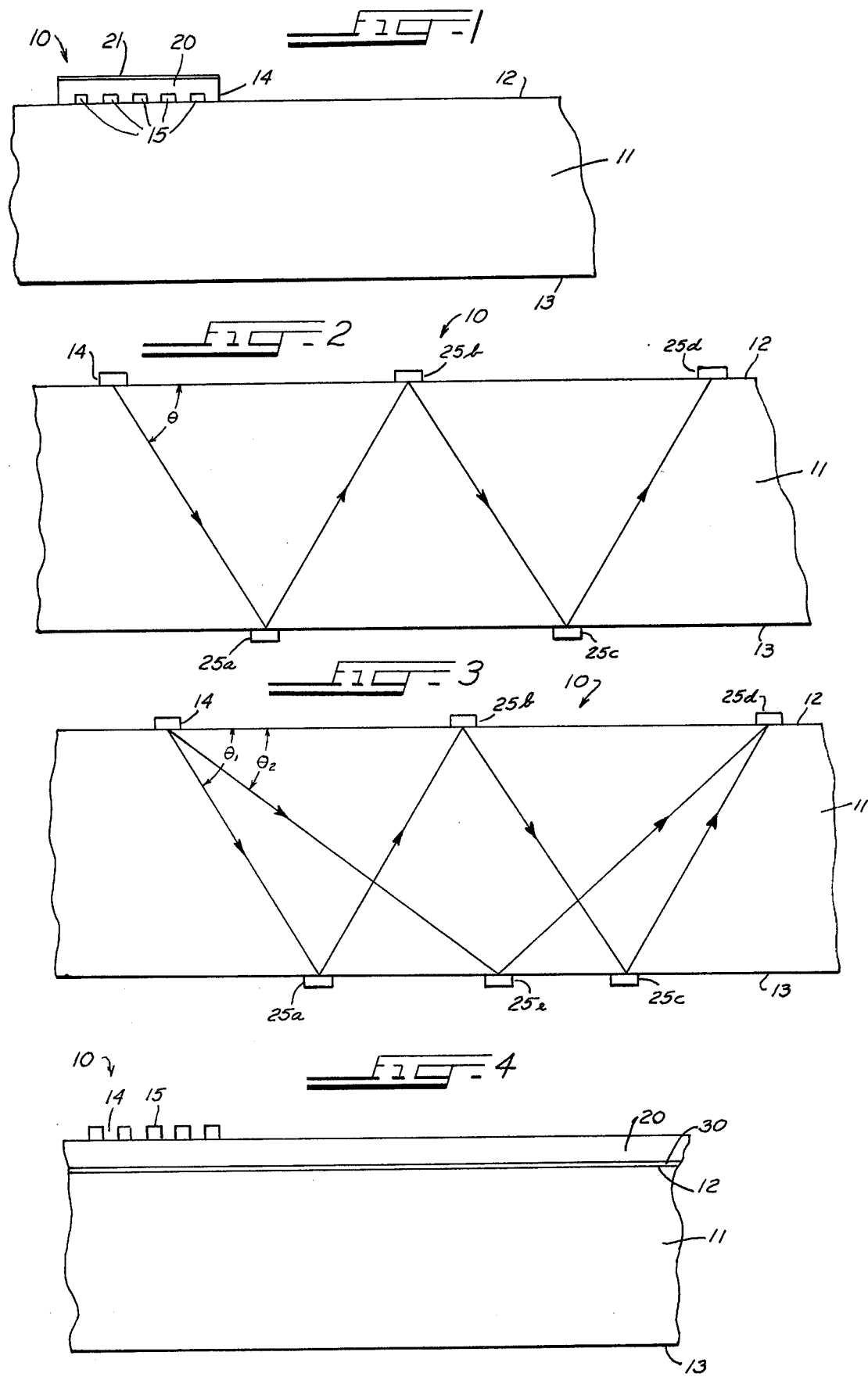

MICROACOUSTIC SHEAR BULK WAVE DEVICE

The invention described herein was made in the course of work under grant ENG. 74-14928 from the National Science Foundation.

BACKGROUND OF THE INVENTION

The present invention relates to devices and techniques for transduction of electrical energy into mechanical energy, and vice versa. These devices and techniques are employed in the design of amplifiers, modulators, detectors amd filters through performance of signal processing functions acoustically rather than electronically.

Devices for transduction of electrical signals into bulk acoustic waves are known in the prior art. However, bulk devices have heretofore suffered from the disadvantage that bulk acoustic waves have been unavailable for processing during delay in a substrate until such waves emerge at an output transducer.

Devices for transduction of electrical signals into surface acoustic waves are also known in the prior art, and such surface acoustic waves are available for processing during delay. However, surface acoustic wave (SAW) devices are useful over a much smaller range of wavelengths compared with bulk devices.

Spurious generation of bulk waves by interdigital surface acoustic wave transducers has previously been studied extensively (1-6). In two recent publications (5,6) the available theoretical and experimental data on bulk wave radiation in surface acoustic wave devices have been reviewed and some techniques for their reduction and control have been suggested. Bulk wave generation by microacoustic devices has heretofore been regarded as a nuisance because of the interference of bulk waves with detection of surface waves, and because it has been thought that bulk waves cannot be tapped for processing prior to their emergence from the substrate.

1. Wagers, R. S., "Analysis of acoustic bulk mode excitation by interdigital tranducers", Applied *Physics Letters*, vol. 24,no.9, pp.401–403, 1 May 1974.
2. Milsom, R., J. Heighway, N. Reilly and M. Redwood, "Comparison of exact theoretical predictions and experimental results for interdigital transducers", *Proc. of IEEE Ultrasonics Symposium*, Milwaukee, Wisconsin 1974, pp. 406–411.
3. Daniel, M. R., "Acoustic radiation from a high coupling cut of lithium niobate", *Journal of Applied Physics*, vol. 44, no. 7, pp. 2942-2945, July 1973.
4. Daniel, M. R., P. R. Emtage and T. deKlerk, "Acoustic radiation by interdigitated grids on LiNbO$_3$", *Proc. of IEEE Ultrasonics Symposium*, Boston, Mass., 1972, pp. 392-395.
5. Mitchell, R. F., "Spurious bulk wave signals in acoustic surface wave devices", *Proc. of IEEE Ultrasonics Symposium*, Milwaukee, Wisconsin, 1974 pp. 313-320.
6. Wagers, R. S., "Spurious acoustic responses in commercial crystals used for acoustic surface wave devices", *Texas Instruments Inc.*, Advanced Technology Laboratory Technical Report, TR-08-75-15, Mar. 26, 1975.

SUMMARY OF THE INVENTION

It is a principal object of the present invention to provide a microacoustic bulk device in which shear bulk waves are available for processing during delay in a substrate.

It is a related object of the present invention to provide a method for processing shear bulk acoustic waves during delay in a substrate.

Another object of the invention is to avoid additional circuits for processing bulk waves propagated in a substrate by a transducer.

It is a further object of the invention to provide a microacoustic device having a large number of output taps in a relatively small substrate.

Yet another object of the present invention is to provide a microacoustic device which is operative at higher frequencies than presently used in surface acoustic wave (SAW) devices.

Additional objects and advantages of the present invention will become apparent to persons skilled in the art from the following specification, taken in conjunction with the drawings.

BRIEF DESCRIPTION OF THE DRAWINGS

FIG. 1 is a schematic illustration of a preferred embodiment of a microacoustic shear bulk wave device produced in accordance with the present invention, said device including only a single input interdigital transducer;

FIG. 2 is a schematic illustration of a second embodiment of a microacoustic shear bulk wave device produced in accordance with the present invention, having an input interdigital transducer and four output interdigital transducers;

FIG. 3 is a schematic illustration of a third embodiment of a microacoustic shear bulk wave device produced in accordance with the present invention, having a single input interdigital transducer and five output transducers; and FIG. 4 is a schematic illustration of a fourth embodiment of an interdigital transducer of the invention, having a conductive layer adjacent the principal surface of the device.

DESCRIPTION OF THE PREFERRED EMBODIMENT

A preferred embodiment of the shear bulk wave device of the invention is illustrated in FIG. 1. The device 10 includes an ST quartz substrate 11 having a thickness of 2.06mm. A principal surface 12 of the substrate and an opposed, parallel second surface 13 are both smooth, polished surfaces.

An interdigital input transducer 14 includes twelve aluminum electrode pairs 15 photo-etched upon the principal surface 12. The transducer 14 has a periodicity of 24.22 μm. The electrode pairs 15 are of equal width and spacing with an aperture of 53 wavelengths. A 6.4μm layer 20 of RF sputtered ZnO lies over the transducer electrodes 15. Other piezoelectric substances such as Al(NO$_3$)$_3$ may be substituted for the ZnO layer.

A thin film 21 of conducting aluminum is deposited over the ZnO layer 20. This film 21 must be sufficiently thin to avoid excessive mechanical loading on the ZnO layer. In the preferred embodiment illustrated this aluminum film 21 has a thickness of about 0.1 μm.

Shear bulk waves propagated by the input transducer 14 are tapped by output transducers 25a, 25b, 25c, 25d placed at spaced locations along the principal and second surfaces, as shown in FIG. 2. The distance between the input transducer 14 and the most distal output transducer 25d is 5.08 mm. The output transducers 25a, 25b, 25c, 25d are identical in structure to the input transducer 14 described above.

The shear bulk wave is propagated at an angle $\phi$ to the principal surface 12. This angle $\phi$ varies, depending upon the thickness of the ZnO layer and the periodicity of the input transducer 14. In the preferred embodiment described herein and illustrated in FIGS. 1 and 2, $\phi = 58.3°$.

Measurement of unmatched frequency response of the device of FIGS. 1 and 2 in a 50 ohm system shows a narrowband output at 116 MHz representing a surface wave, and a wide-band peak centered at 205 MHz which is only moderately affected by loading the principal surface 12 between the input transducer 14 and the output transducer 25d. The signal at 205 MHz is about 10 dB stronger than the surface signal and, unlike the latter, is enhanced by depositing a thin film of conducting aluminum over the ZnO layer. The enhancement due to an overlying conductor results from concentration of the electric potential at the location of the transducer 14. While this effect has been studied in detail for Rayleigh waves, the leaky wave equivalent has not been fully analyzed.

At the boundaries represented by polished surfaces 12, 13 of the substrate, the shear bulk wave is reflected and continues along the bouncing path indicated in FIG. 2. By placing transducers 25a, 25b, 25c at the locations of wave reflections, it is possible to detect the signal. Such arrangement provides a tapped delay line with a large number of output taps in a relatively small substrate.

The device can be designed to provide signals at two different center frequencies, which results in propagation of shear bulk waves at two different angles $\phi_1$, $\phi_2$ as shown in FIG. 3. The waves thus propagated may be picked up by the same output transducers, or by separate ones. Such devices are useful for signal discrimination such as employed in frequency demultiplexers.

It is a significant advantage of the device 10 described herein that the input transducer 14 and output transducers 25a, 25c, 25e are located on opposed surfaces of the substrate 14, thereby providing better electromagnetic isolation than is obtainable in SAW devices. This feature is advantageous in the design of acoustic-wave filters. Electromagnetic isolation of the transducers can be further enhanced by interposing a thin conductive plane 30 between the principal surface 12 and the ZnO layer 20, as shown in FIG. 4.

It should be noted that the function of ST quartz in the substrate 14 is to provide the property of small dispersion or beam spreading over a wide frequency range. The fact that ST quartz is crystalline and piezoelectric is only incidental and plays no role in the transduction process.

A device (not illustrated) similar to the one described above has been prepared using a fused quartz substrate. Thickness of the substrate is 1.04 mm and the ZnO layer is 6.22 $\mu$m thick all other dimensions being essentially unchanged. The unmatched frequency response of this fused quartz device in a 50 ohm system showed a shear bulk wave response peak at 209 MHz and a surface wave signal at 115MHz. The band width obtained with this device is smaller than in the device made of ST quartz. Because fuzed quartz is neither crystalline nor piezoelectric, it is believed that any homogeneous substance will serve as an effective substrate in devices produced in accordance with the present invention.

Shear bulk waves are propagated by the input transducer 14 in opposite directions through the substrate. Analogous to techniques presently employed with SAW transducers, output transducers may be positioned in opposite directions of shear bulk wave propagation rather than in only a single direction, as shown in FIGS. 2 and 3. This enhances sensitivity of the device by a factor of at least two.

While the invention has been described with reference to several preferred embodiments, it will be apparent that numerous changes and modifications may be made therein without departing from the spirit and scope of the invention as described in the following claims.

What is claimed is:

1. A microacoustic shear bulk wave device comprising
    a substrate having a principal surface and a second surface opposed to said principal surface;
    an input interdigital transducer supported on said principal surface and comprising a plurality of interdigital electrodes, a piezoelectric layer adjacent said electrodes, and a conductive film adjacent said piezoelectric layer, and
    an output transducer adjacent said second surface of said substrate;
    wherein ultrasonic wave energy is propagated by said input interdigital transducer at an angle $\phi$ which is not an angle substantially normal to said principal surface, said angle $\phi$ being a function of thickness of the piezoelectric layer and periodicity of the input interdigital transducers, and said output transducer is located laterally of a normal to said input interdigital transducer in a path of ultrasonic wave energy propagated by said input interdigital transducer.

2. The device of claim 1, wherein said second surface is a polished surface, and further comprising another output transducer adjacent said principal surface of the substrate and in a path of ultrasonic wave energy reflected by said second surface.

3. The device of claim 1, wherein said input transducer and said output transducer are matched in frequency.

4. The device of claim 1, wherein said piezoelectric layer comprises ZnO.

5. The device of claim 4, wherein the ZnO in said piezoelectric layer has a thickness of 6.4$\mu$m, said input interdigital transducer has a periodicity of 24.22$\mu$m, and $\phi = 58.3°$.

6. The device of claim 1, wherein said principal surface is a polished surface.

7. A method for processing a shear bulk acoustic wave during delay in a substrate, said method comprising the steps of
    (a) generating an electrical signal in an input transducer comprising a plurality of interdigital electrodes, said input transducer being situated adjacent a principal surface of a substrate having a polished second surface, there being a piezoelectric layer adjacent said electrodes and a conductive film adjacent said piezoelectric layer, thereby propagating in said substrate a shear bulk wave at an angle $\phi$ to the principal surface which is not a right angle, said angle $\phi$ being a function of thickness of the piezoelectric layer and periodicity of the input transducer;

(b) reflecting said shear bulk wave toward the principal surface at the polished second surface; and (c) transducing said shear bulk wave into an electrical signal by means of an output transducer situated adjacent said principal surface at a location spaced apart from said input transducer and in the path of the shear bulk wave reflected from the polished second surface.

8. The method of claim 7, and further comprising the step of tapping the shear bulk wave by means of another output transducer situated adjacent the polished second surface of the substrate in the path of the shear bulk wave.

* * * * *